United States Patent
Lyons et al.

(10) Patent No.: US 6,358,856 B1
(45) Date of Patent: Mar. 19, 2002

(54) BRIGHT FIELD IMAGE REVERSAL FOR CONTACT HOLE PATTERNING

(75) Inventors: Christopher F. Lyons, Fremont; Ramkumar Subramanian, Sunnyvale; Marina V. Plat; Todd P. Lukanc, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/716,215

(22) Filed: Nov. 21, 2000

(51) Int. Cl.[7] .......................................... H01L 21/311
(52) U.S. Cl. ........................................ 438/703; 438/713
(58) Field of Search .............................. 438/382, 385, 438/700, 703, 712, 713, 714, 715, 732, 158, 314, 395, 583, 622, 669

(56) References Cited

U.S. PATENT DOCUMENTS

| | | | | |
|---|---|---|---|---|
| 5,891,807 A | * | 4/1999 | Muller et al. ................ | 438/713 |
| 5,976,944 A | * | 11/1999 | Czagas et al. ............... | 438/382 |
| 6,054,254 A | * | 4/2000 | Sato et al. ................... | 430/322 |
| 6,080,654 A | * | 6/2000 | Manchester ................. | 438/622 |
| 6,218,057 B1 | * | 4/2001 | Cirelli et al. ................ | 430/5 |

OTHER PUBLICATIONS

R. Wolf et al., Silicon Processing for the VLSI Era, vol. I, 1990 edition, pp. 418, 420.

* cited by examiner

Primary Examiner—David Nelms
Assistant Examiner—Phuc T. Dang
(74) Attorney, Agent, or Firm—Foley & Lardner

(57) ABSTRACT

A method of forming a small contact hole uses a bright field mask to form a small cylinder in a positive resist layer. A negative resist layer is formed around the small cylinder, and then etched or polished back to leave a top portion of the small cylinder exposed above the negative resist layer. The negative resist layer and the small cylinder (positive resist) are flood exposed to light, and then subject to a developer. What remains is a small contact hole located where the small cylinder was previously located.

13 Claims, 3 Drawing Sheets

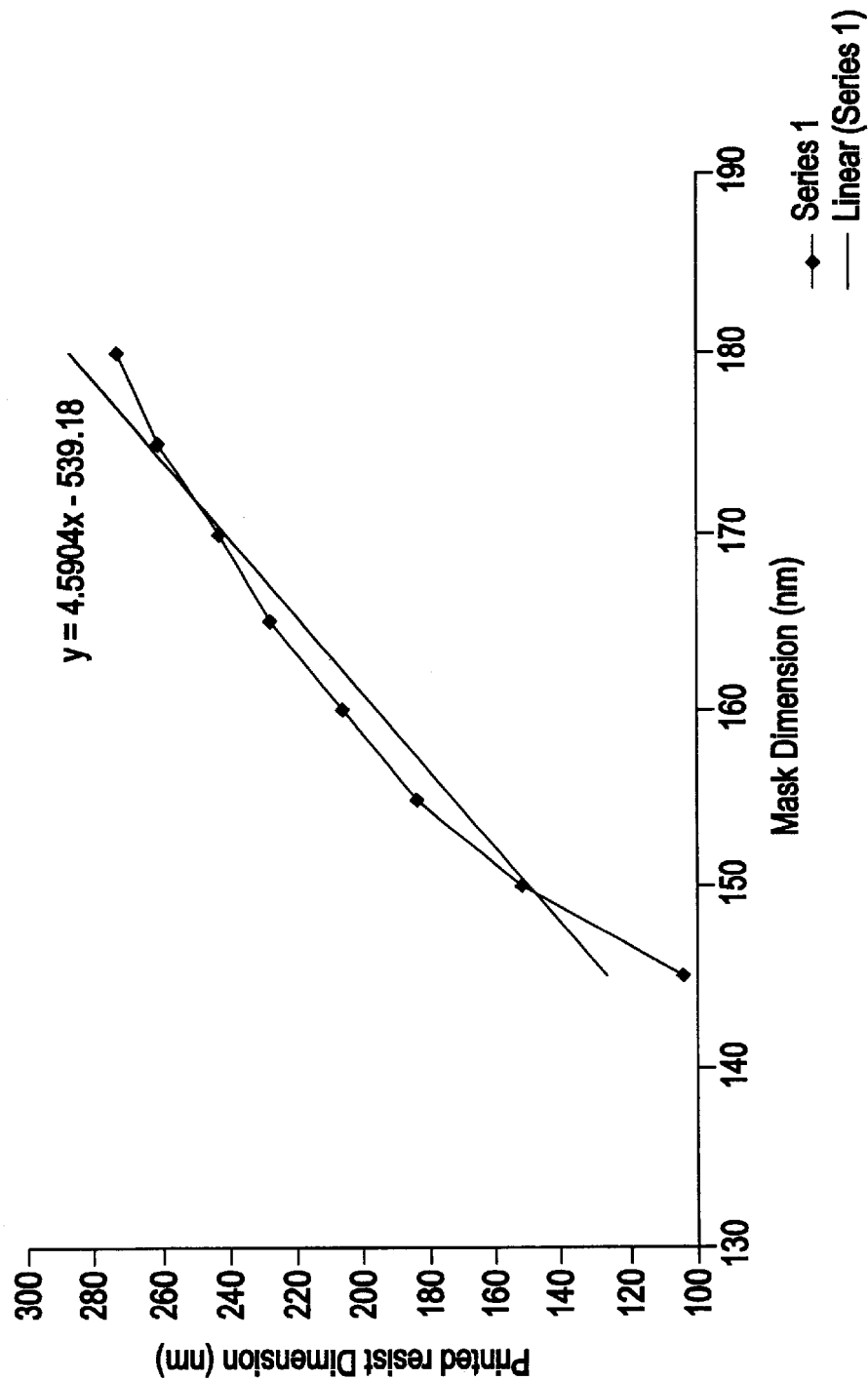

BRIGHT FIELD IMAGE REVERSAL FOR CONTACT HOLE PATTERNING

BACKGROUND OF THE INVENTION

1. Field of the Invention

This invention relates generally to contact hole patterning. More particularly, this invention relates to bright field image reversal for contact hole patterning.

2. Description of the Related Art

Semiconductor critical dimensions (CD) are becoming increasingly smaller to accommodate faster, smaller and more powerful semiconductor devices.

Contact holes are an important requirement for forming semiconductor devices. Typically, contact holes are formed using a dark field mask and a positive photoresist. Positive photoresists are typically three-component materials, having a matrix component, a sensitizer component, and a solvent component, whose properties are changed by a photochemical transformation of the photosensitive component, from that of a dissolution inhibitor to that of a dissolution enhancer. See, for example, R. Wolf, Silicon Processing for the VLSI Era, Volume 1, page 418.

For forming very small contact hole features, such as contact holes or vias less than 100 nanometers in dimension, dark field patterning causes some problems, since it provides for poor CD control in these very small size ranges. This is primarily due to the resolution of small contact hole features using a dark field mask and positive photoresist being difficult to control due to resolution limits and high mask error factor sensitivity (MEF).

SUMMARY OF THE INVENTION

Accordingly, it is a general object of the present invention to provide an improved method of forming small contact holes for semiconductor devices.

In accordance with a preferred embodiment of the present invention, the above object may be achieved by a method of forming a contact hole for a semiconductor device. The method includes a step of forming an interlayer dielectric layer on a substrate, and then forming a positive resist on the interlayer dielectric layer. The method then includes a step of irradiating the positive resist using a bright field mask, with reversed polarity (dark vs. bright) of a normal contact mask. The bright field mask has a dimension equal in size to a dimension of a contact hole to be formed within the semiconductor device. The method further includes a step of developing the irradiated positive resist, so as to remove the irradiated positive resist, thereby leaving only a portion of the positive resist remaining above the interlayer dielectric layer. The method still further includes a step of applying a negative resist to cover the interlayer dielectric layer and the portion of the positive resist, and then recessing the negative resist so that a top region of the portion of the positive resist extends above the recessed negative resist. The method also includes a step of exposing the recessed negative resist and the portion of the positive resist to a flood light exposure, and then applying a developer to the semiconductor device so as to remove the portion of the positive resist. As a result, a via or contact hole is formed in the location where the portion of the positive resist was previously formed.

The above object may also be achieved by a method for forming a contact hole for a semiconductor device. The method includes forming a first layer on a substrate, and then forming a positive resist on the first layer. The method also includes irradiating the positive resist using a bright field mask, wherein the bright field mask has a dimension equal in size to a dimension of a contact hole to be formed within the semiconductor device. The method further includes subjecting the irradiated positive resist to a developer, so as to remove the irradiated positive resist, thereby leaving only a portion of the positive resist remaining above the first layer. The method still further includes applying a negative resist to cover the first layer and the portion of the positive resist. The method also includes recessing the negative resist so that the portion of the positive resist is not covered on its top surface by the negative resist. The method further includes exposing the recessed negative resist and the portion of the positive resist to light. The method still further includes applying a developer to the semiconduct of device so as to dissolve the portion of the positive resist. As a result, a contact hole is formed in a location where the portion of the positive resist was previously formed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a plot of the MEF for the formation of a contact using a dark field mask.

DETAILED DESCRIPTION OF THE PREFERRED EMBODIMENT

A major concern in conventional lithographic processes is that the processes are reaching the size limit in contact hole formation, especially for forming contact holes of 100 nanometers (nm) or less in size. As explained earlier, the conventional contact hole formation uses a dark field mask and a positive photoresist, which results in difficulty in control due to resolution limits and high MEF.

Figure 1:
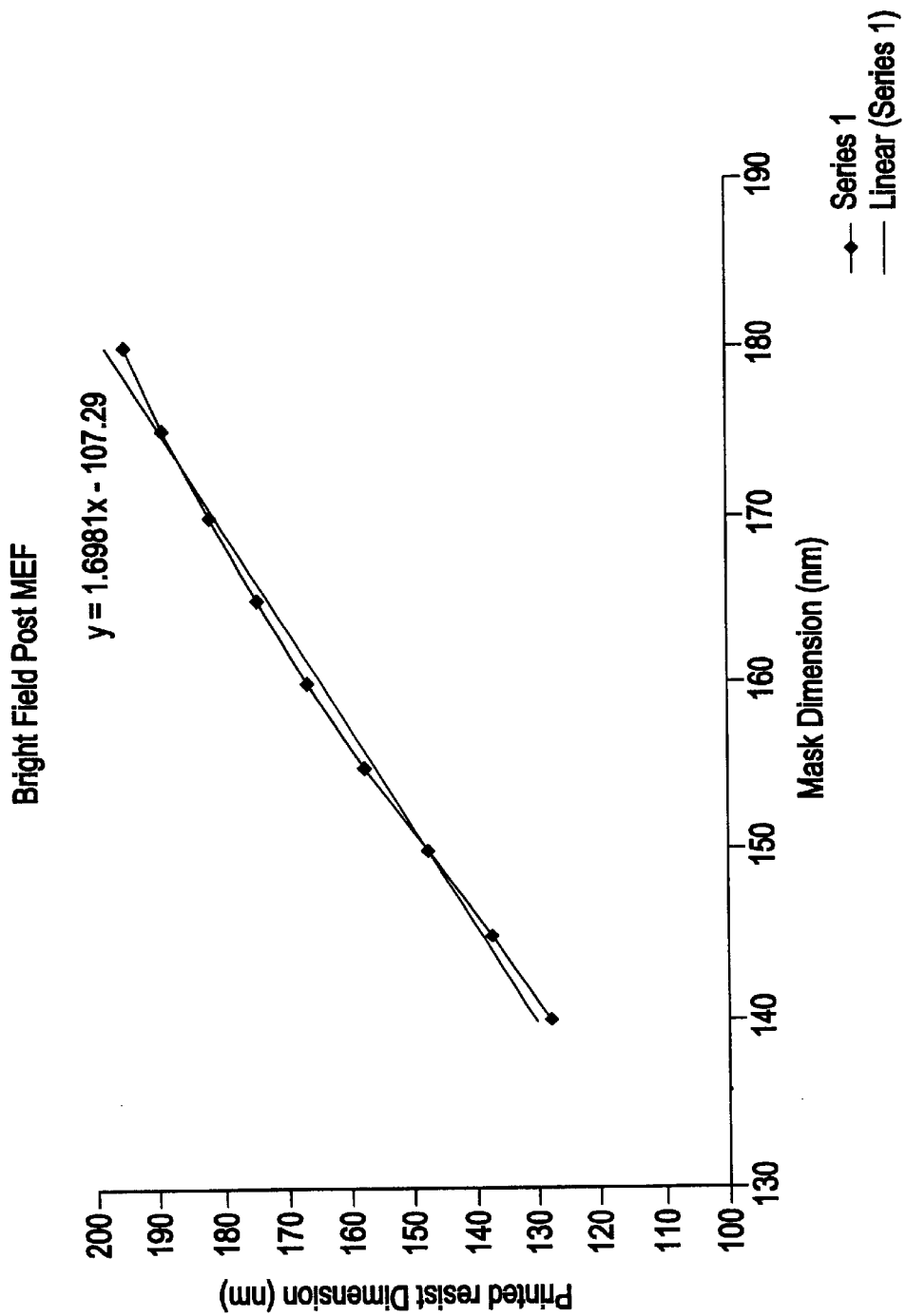
FIG. 1 is a plot of the MEF for the formation of a post using a bright field mask.

FIG. 1 shows the MEF for a bright field mask, and FIG. 2 shows the MEF for a dark field mask. These two figures show the sensitivity of the wafer dimension to the mask dimension. The measure of MEF is the slope of the line which is approximated by the first term in the equation of the line that's printed on the graph. The dark field mask change leads to a wafer (resist) change 4.6 times greater. The bright field mask change is magnified 1.7 times at the wafer. Thus, as seen from the plots shown in FIGS. 1 and 2, the amount of contact hole variation on a wafer will be much less using the bright field mask as compared with using a dark field mask. The data shown in FIGS. 1 and 2 are based on tests performed by the inventors.

The present invention overcomes the problems in small contact hole formation by forming a small cylinder in a positive photoresist using a bright field (BF) mask, whereby resolution and MEF are improved as compared to conventional lithographic processes. Further processing to reverse the image forms a well-controlled contact hole pattern. Bright field masks are masks where most of the mask is transparent with only a fraction of the mask opaque.

Figure 3A:
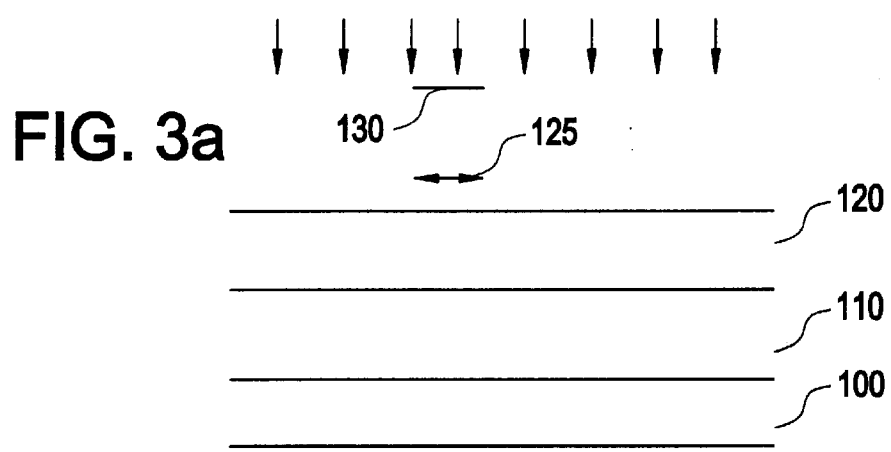
FIGS. 3(a)–3(d) illustrate cross-sectional views of the lithographic process of the present invention.

The present invention will now be described in detail with reference to FIGS. 3(a) to 3(d). FIG. 3(a) shows a cross-sectional view of a semiconductor structure that includes a substrate 100, an interlayer dielectric layer 110, and a positive photoresist layer 120. The interlayer dielectric layer 110 may be any conventional low-k dielectric, i.e., a dielectric with a low dielectric constant, such as SILK, that provides a nonconductive shield between conductive layers.

As shown in FIG. 3(a), a bright field (BF) mask 130 is provided above the semiconductor structure, and the positive photoresist layer 120 is illuminated with light from a light source located above the BF mask 130. As a result, most of the positive photoresist layer 120 is exposed to the light, except for a portion 125 directly below the BF mask 130. A typical mask includes transparent regions and opaque regions. The light impinges on the entire mask, and passes through the transparent regions to regions directly below on the substrate, but does not pass through the opaque regions to regions directly below on the substrate.

Figure 3B:
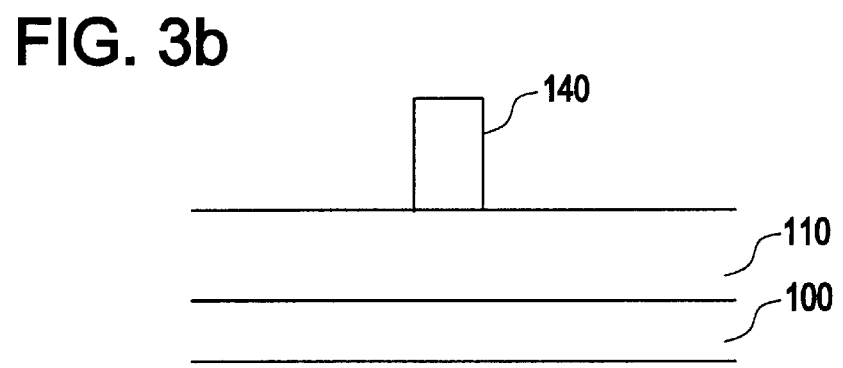

FIG. 3(b) shows the semiconductor structure after the positive photoresist layer 120 has been in contact with a developer solution. The developer solution acts to dissolve the light-exposed portion of the positive photoresist layer 120, leaving only a small cylinder 140 remaining above the interlayer dielectric layer 110. Any type of conventional developer solution for removing positive photoresist may be used in this step. In general, the cylinder 140 need not have a circular cross-section, but may alternatively have other cross-sectional shapes.

Figure 3C:
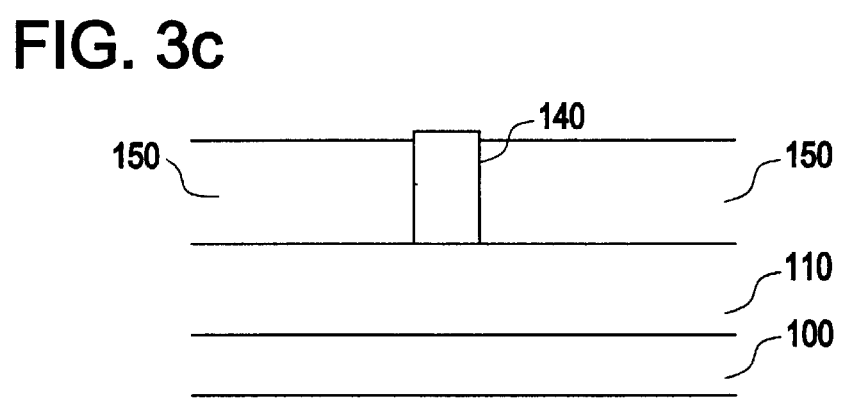

FIG. 3(c) shows the semiconductor structure after a negative photoresist layer 150 has been formed around the small cylinder 140. A negative photoresist is a resist that acts oppositely from a positive photoresist, in that when a portion of a negative photoresist is exposed to light, it hardens and will not be dissolved when placed in a developer. All nonexposed portions of the negative photoresist will not harden and thus will be dissolved when placed in the developer.

Negative photoresists have typically not been utilized in photolithography as VLSI structures have gotten smaller and smaller, since the swelling of negative photoresists during development makes them unsuitable for CDs less than 3 micrometers. See R. Wolf, Silicon Processing for the VLSI Era, Vol. 1, page 420. However, the present invention utilizes negative photoresists in a novel manner to provide a method for forming contact holes having very small dimensions.

Referring back to FIG. 3(c), the negative photoresist layer 150 is formed so that its top surface is substantially coplanar with the top surface of the small cylinder 140 (which is a positive photoresist structure). In one configuration, the negative photoresist layer 150 is spin-coated onto the semiconductor structure so that its top surface is just below (e.g., by a few tens of angstroms) the top surface of the small cylinder 140, thereby leaving a stub of the small cylinder 140 extending out from the top surface of the negative photoresist layer 150. In a second configuration, the negative photoresist layer 150 is spin-coated onto the semiconductor structure so that its top surface is formed above and thus filly covers the small cylinder 140 by a small amount (e.g., a few angstroms up to a few tens of angstroms). With this second configuration, the negative photoresist layer 150 is etched back or polished so that a small portion of the top of the small cylinder 140 (e.g., a few angstroms up to a few tens of angstroms) extends out from the top surface of the negative photoresist layer 150.

Other ways of forming the negative photoresist layer 150 onto the semiconductor structure, besides spin-coating, may be contemplated, while remaining within the scope of the invention. For example, spray coating, meniscus coating, or doctor blade coating may be used for forming the negative photoresist layer 150.

As shown in FIG. 3(c), a layer that includes a negative photoresist layer 150, and that also includes a small cylinder 140 that is formed out of positive photoresist, is provided as a combined layer above the interlayer dielectric layer 110.

Figure 3D:
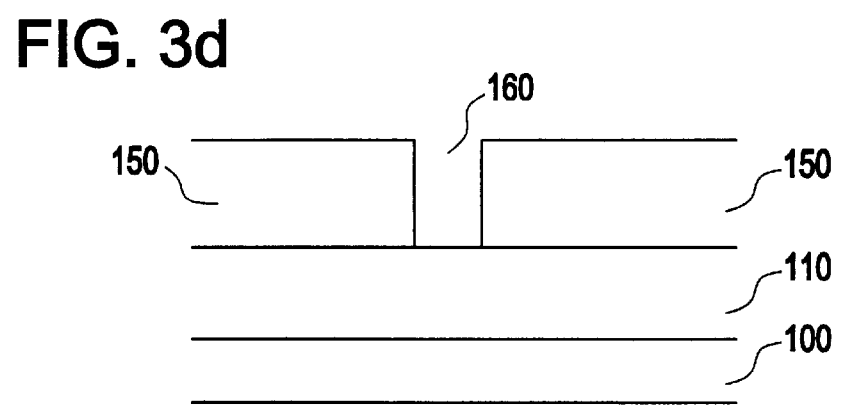

FIG. 3(d) shows the semiconductor structure after the structure has been subject to flood light exposure, i.e., the entire top surface is exposed, and then subject to a developer. The developer used to arrive at the structure shown in FIG. 3(d) may be the same developer used to remove most of the positive photoresist layer 120 to arrive at the structure shown in FIG. 3(b). Referring again to FIG. 3(d), when the developer contacts the negative photoresist layer 150, the negative photoresist layer is not dissolved, since it was previously subject to light by way of the flood light exposure. The small cylinder 140, on the other hand, is dissolved when exposed to the developer, since the flood light exposure changes its characteristics to make it soluble in the developer (since the small cylinder 140 is formed out of positive photoresist).

As a result, what remains is a cylindrical hole 160, formed in the place where the small cylinder 140 was previously located (e.g., before it dissolved in the developer). The photoresist layer 150 surrounding the hole 160 can then be used as a resist pattern to etch a small contact hole in the dielectric layer 110, such as a contact hole to a gate of a transistor, to be formed within the semiconductor structure. Since a bright field mask and a positive photoresist are used in the formation of the resist pattern for a small-sized contact hole according to the present invention, excellent control can be achieved in forming a contact hole to a precise, small size (e.g., less than 200 nm). Such control is not readily accomplished by the conventional methods that use a dark field mask to form contact holes.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method of forming a contact hole for a semiconductor device, comprising:

forming an interlayer dielectric layer on a substrate, and then forming a positive resist on the interlayer dielectric layer;

irradiating the positive resist to form an irradiated positive resist layer using a bright field mask, wherein the bright field mask has a pattern corresponding to a contact hole to be formed within the semiconductor device;

developing the positive resist, so as to remove the irradiated positive resist layer, thereby leaving only a portion of the positive resist remaining above the interlayer dielectric layer;

applying a negative resist to cover the interlayer dielectric layer and the portion of the positive resist;

recessing the negative resist so that a top region of the portion of the positive resist extends above the recessed negative resist;

exposing the recessed negative resist and the portion of the positive resist to a flood light exposure; and applying a developer to the semiconductor device so as to remove the portion of the positive resist, wherein a contact hole is formed in a location where the portion of the positive resist was previously formed.

2. The method according to claim 1, wherein the negative resist is recessed by plasma etching back the negative resist.

3. The method according to claim 1, wherein the negative resist is recessed by wet chemical etching back the negative resist.

4. The method according to claim 1, wherein negative resist is recessed by polishing the negative resist.

5. The method according to claim 1, wherein the negative resist is a negative photoresist.

6. The method according to claim 5, wherein the positive resist is a positive photoresist.

7. The method according to claim 1, wherein in the recessing step, a top surface of the negative resist is recessed to a level of between 2 and 20 angstroms beneath a top surface of the portion of the positive resist.

8. A method of forming a contact hole for a semiconductor device, comprising:

forming a first layer on a substrate, and then forming a positive resist on the first layer;

irradiating the positive resist using a bright field mask, wherein the bright field mask has a dimension equal in size to a dimension of a contact hole to be formed within the semiconductor device;

subjecting the irradiated positive resist to a developer, so as to remove the irradiated positive resist, thereby leaving only a portion of the positive resist remaining above the first layer;

applying a negative resist to cover the first layer and the portion of the positive resist;

recessing the negative resist so that the portion of the positive resist is not covered on its top surface by the negative resist;

exposing the recessed negative resist and the portion of the positive resist to light; and applying a developer to the semiconductor device so as to dissolve the portion of the positive resist, wherein a contact hole is formed in a location where the portion of the positive resist was previously formed.

9. The method according to claim 8, wherein the negative resist is recessed by plasma etching back the negative resist.

10. The method according to claim 8, wherein the negative resist is recessed by wet chemical etching back the negative resist.

11. The method according to claim 8, wherein the negative resist is recessed by polishing the negative resist.

12. The method according to claim 8, wherein the negative resist is a negative photoresist.

13. The method according to claim 8, wherein the positive resist is a positive photoresist.

* * * * *